United States Patent
Dudek

(10) Patent No.: US 10,854,760 B2
(45) Date of Patent: Dec. 1, 2020

(54) STACKED III-V SEMICONDUCTOR DIODE

(71) Applicant: 3-5 Power Electronics GmbH, Dresden (DE)

(72) Inventor: Volker Dudek, Ettlingen (DE)

(73) Assignee: 3-5 Power Electronics GmbH, Dresden (DE)

(*) Notice: Subject to any disclaimer, the term of this patent is extended or adjusted under 35 U.S.C. 154(b) by 0 days.

(21) Appl. No.: 16/252,137

(22) Filed: Jan. 18, 2019

(65) Prior Publication Data

US 2019/0221676 A1 Jul. 18, 2019

(30) Foreign Application Priority Data

Jan. 18, 2018 (DE) .................. 10 2018 000 395

(51) Int. Cl.
*H01L 29/86* (2006.01)
*H01L 29/861* (2006.01)
(Continued)

(52) U.S. Cl.
CPC .......... *H01L 29/8611* (2013.01); *H01L 29/06* (2013.01); *H01L 29/20* (2013.01);
(Continued)

(58) Field of Classification Search
CPC ......... H01L 2924/00; H01L 2924/0002; H01L 33/32; H01L 21/0254; H01L 21/0262
See application file for complete search history.

(56) References Cited

U.S. PATENT DOCUMENTS 4,738,935 A 4/1988 Shimbo et al.
5,159,296 A 10/1992 Nelson
(Continued)

FOREIGN PATENT DOCUMENTS

CN 104701162 A 6/2015
DE 102015115723 A1 3/2016
(Continued)

OTHER PUBLICATIONS

Koel et al, "Characterization of the temperateure dependent behavior of snappy phenomenon by the switching-off of GaAs power diode structures", Advances in Fluid Mechanics XI, Jul. 1, 2014, pp. 439-449, ISBN 978-1-78466-105-2.
(Continued)

*Primary Examiner* — Tony Tran
(74) *Attorney, Agent, or Firm* — Muncy, Geissler, Olds & Lowe, P.C.

(57) ABSTRACT

A stacked III-V semiconductor diode having an $n^-$ layer having a first surface, a second surface, a dopant concentration of $10^{12}$ N/cm$^3$ to $10^{17}$ N/cm$^3$ and a layer thickness of 50 µm to 1,000 µm, a $p^+$ layer, which is integrally connected to the first surface and has a dopant concentration of $5 \cdot 10^{18}$ N/cm$^3$ to $5 \cdot 10^{20}$ N/cm$^3$, an $n^+$ layer, which is integrally connected to the second surface and has a dopant concentration of at least $10^{19}$ N/cm$^3$. The $p^+$ layer, the $n^-$ layer and the $n^+$ layer each having a monolithic design and each being made up of a GaAs compound. The dopant concentration of the $n^-$ layer having a first value on the first surface and a second value on the second surface, and the second value of the dopant concentration being greater than the first value at least by a factor between 1.5 and 2.5.

16 Claims, 1 Drawing Sheet

(51) Int. Cl.
  *H01L 29/36* (2006.01)
  *H01L 29/06* (2006.01)
  *H01L 29/20* (2006.01)
  *H01L 29/66* (2006.01)

(52) U.S. Cl.
  CPC ............ *H01L 29/36* (2013.01); *H01L 29/861* (2013.01); *H01L 29/66204* (2013.01)

(56) References Cited

U.S. PATENT DOCUMENTS

| | | |
|---|---|---|
| 5,733,815 A | 3/1998 | Ashkinazi et al. |
| 5,811,873 A | 9/1998 | Soejima |
| 9,324,783 B2 | 4/2016 | Falck et al. |
| 9,647,083 B2 | 5/2017 | Schloegl et al. |
| 10,186,587 B2 | 1/2019 | Kuenle et al. |
| 2017/0243963 A1 | 8/2017 | Schloegl et al. |
| 2019/0157401 A1 | 5/2019 | Kuenle et al. |
| 2019/0198625 A1 | 6/2019 | Dudek |

FOREIGN PATENT DOCUMENTS

| | | |
|---|---|---|
| DE | 102015208097 A1 | 11/2016 |
| DE | 102016111844 A1 | 12/2017 |
| EP | 0749166 A1 | 12/1996 |
| EP | 3503204 A2 | 6/2019 |
| JP | S61183915 A | 8/1986 |
| JP | H06196724 A | 7/1994 |
| JP | H06314801 A | 11/1994 |
| JP | H08316500 A | 9/1998 |
| JP | 2000164891 A | 6/2000 |
| JP | 2005079232 A | 3/2005 |

OTHER PUBLICATIONS

Simon et al, "Gallium arsenide semiconductor parameters extracted from pin diode measurements and simulations", IET Power Electronics, Mar. 30, 2016, pp. 689-697.

Ashkinazi, "GaAs Power Devices," ISBN 965-7094-19-4, pp. 8-9 (1999).

STACKED III-V SEMICONDUCTOR DIODE

This nonprovisional application claims priority under 35 U.S.C. § 119(a) to German Patent Application No. 10 2018 000 395.8, which was filed in Germany on Jan. 18, 2018, and which is herein incorporated by reference.

BACKGROUND OF THE INVENTION

Field of the Invention

The present invention relates to a stacked III-V semiconductor diode.

Description of the Background Art

A high voltage-resistant semiconductor diode $p^+$-n-$n^+$ is known from "GaAs Power Devices" by German Ashkinazi, ISBN 965-7094-19-4, pages 8 and 9.

SUMMARY OF THE INVENTION

It is an object of the present invention to provide a device which refines the prior art.

According to an exemplary embodiment of the invention, a stacked III-V semiconductor diode comprising an $n^-$ layer having a first surface and a second surface opposite the first surface is provided.

The $n^-$ layer has a dopant concentration of $10^{12}$ N/cm$^3$ to $10^{17}$ N/cm$^3$ and a layer thickness of 50 µm to 1,000 µm.

The first surface of the $n^-$ layer is integrally connected to a $p^+$ layer, the $p^+$ layer having a dopant concentration of $5 \cdot 10^{18}$ N/cm$^3$ to $5 \cdot 10^{20}$ N/cm$^3$, or an intermediate layer is formed between the first surface of the $n^-$ layer and the $p^+$ layer.

The second surface of the $n^-$ layer is integrally connected to an $n^+$ layer, the $n^+$ layer having a dopant concentration of at least $10^{19}$ N/cm$^3$.

The $p^+$ layer and the $n^-$ layer and the $n^+$ layer each have a monolithic design and each include a GaAs compound or are made up of a GaAs compound.

The $n^+$ layer or the $p^+$ layer is designed as a substrate layer. The dopant concentration on the first surface of the $n^-$ layer has a first value, and the dopant concentration on the second surface of the $n^-$ layer has a second value.

The second value of the dopant concentration is greater than the first value by a factor of at least 1.5 or by a factor of at least 2 or by a factor of at least 2.5.

It is understood that the expression, on the surface, can be understood to be an area of the surface having a depth of approximately 1.0 µm in the relevant layer, and the dopant concentration, in particular, is an average concentration in the aforementioned area. It should also be noted that the term, dopant concentration, is understood in the present case to be only the activated part of the dopant.

The terms, dopant concentration and dopant, are used synonymously below.

In contrast to the belief held up to now that GaAs is namely suitable only for rapid components having voltages of less than 20 V, or that GaAs is suitable for solar cells having reverse voltages in the low voltage range, i.e. less than 10 volts, it has very surprisingly been shown that high-blocking semiconductor components may be manufactured from GaAs with the aid of the aforementioned layer structure, in particular with the design of thick $n^-$ layers, i.e. layers above 30 µm or preferably above 60 µm.

It has furthermore been shown that thick GaAs layers may surprisingly be easily, quickly and cost-effectively manufactured, preferably epitaxially, with good crystal quality.

It should be noted that in the present case the term "high-blocking components" can be understood to be only semiconductor components having a reverse voltage greater than 100 V.

The III-V semiconductor diode according to the invention has improved electrical properties compared to known semiconductor diodes. The III-V semiconductor diode according to the invention thus makes it possible to easily produce reverse voltages in a range of 200 V to 3,300 V, with lower turn-on resistances and lower capacitances per unit area than conventional high-blocking diodes made from Si or SiC. Switching frequencies from 30 kHz up to 0.5 GHz and current densities from 0.5 A/mm$^2$ to 5 A/mm$^2$ are achievable hereby.

In addition, the III-V semiconductor diodes according to the invention may be manufactured more cost-effectively than comparable high-blocking diodes made from SiC. The III-V semiconductor diodes according to the invention are suitable, in particular, as freewheeling diodes.

It should be noted that, in the present case, the III-V semiconductor diodes according to the invention have low turn-on resistances in a range between 1 mOhm and 200 mOhm. The capacitances per unit area are in a range between 2 pF and 100 pF.

Another advantage of the III-V semiconductor diode according to the invention is a high thermal stability of up to 300° C. In other words, the III-V semiconductor diodes may also be used in hot environments.

The semiconductor component typically has at least two terminal contacts, preferably designed as layers, the terminal contacts each being electrically conductive and having metallic properties.

The terminal contacts can be made up of metallically conductive semiconductor layers or metal layers or a combination of the two. The terminal contacts establish an electrically low-resistance contact to the directly adjacent doped semiconductor layers.

The terminal contacts can be connected to contact fingers, so-called pins, with the aid of bonding wires or soldered bonds. The terminal contacts are preferably disposed on an upper side or an underside of the stack formed from the semiconductor areas or semiconductor layers.

The dopant concentration of the $n^-$ layer can have a stepped curve in parallel to the layer thickness from the first value to the second value, the stepped curve including at least one step.

Alternatively the dopant concentration of the $n^-$ layer can have a continuous curve running in parallel to the layer thickness of the $n^-$ layer from the first value to the second value. The continuous curve can have a constant slope.

The three semiconductor layers can have a monolithic design, i.e. either the $p^+$ layer is designed as the substrate, the $n^-$ layer can be epitaxially generated on the substrate and the $n^+$ layer on the $n^-$ layer, or the $n^+$ layer forms the substrate, the $n^-$ layer being epitaxially grown on the substrate and the $p^+$ layer on the $n^-$ layer.

The $p^+$ layer can be designed as the substrate having a layer thickness of 50 µm to 500 µm, and the $n^+$ layer has a layer thickness of less than 30 µm. Alternatively, the $n^+$ layer is designed as the substrate having a layer thickness of 50 µm to 400 µm, and the $p^+$ layer has a layer thickness greater than 2 µm.

The p⁺ layer can include zinc. The n⁺ layer and/or the n⁻ layer preferably include(s) chromium and/or silicon and/or palladium and/or tin.

A total height of a stacked layer structure, made up of the p⁺ layer, the n⁻ layer and the n⁺ layer, is a maximum of 150 µm to 500 µm.

A stacked layer structure, made up of the p⁺ layer, the n⁻ layer and the n⁺ layer, can have a rectangular or square surface, with edge lengths between 1 mm and 10 mm. Alternatively, the stacked layer structure has an oval or circular surface.

The stacked layer structure, made up of the p⁺ layer, possibly the optional intermediate layer, the n⁻ layer and the n⁺ layer, can include a semiconductor bond formed between the n⁻ layer and the intermediate layer or between the n⁻ layer and the p⁺ substrate.

The term semiconductor bond can be used synonymously with the term wafer bond.

The layer structure, made up of the p⁺ layer and possibly the optional intermediate layer, forms a first partial stack.

The layer structure made up of the n⁺ layer and the n⁻ layer forms a second partial stack. The first partial stack and the second partial stack each can have a monolithic design.

The first partial stack can be formed in that the optional intermediate layer is produced, starting from a p⁺ substrate, possibly with the aid of epitaxy.

The intermediate layer designed as the p⁻ layer can have a doping of less than $10^{13}$ N/cm⁻³ or a doping between $10^{13}$ N/cm⁻³ and $10^{15}$ N/cm⁻³.

The p⁺ substrate can be reduced to a thickness between 200 µm and 500 µm upstream or downstream from the bonding, using a grinding process.

The second stack can be formed in that, starting from an n⁻ substrate, the n⁻ substrate is connected to the second stack using a wafer bonding process.

In another process step, the n⁻ substrate can be reduced to the desired thickness. The thickness of the n⁻ substrate can be in a range between 50 µm and 250 µm.

The doping of the n⁻ substrate can be in a range between $10^{13}$ N/cm⁻³ and $10^{15}$ N/cm⁻³. One advantage of wafer bonding is that it is readily possible to produce very thick n⁻ layers greater than 50 µm. A long deposition process during epitaxy is eliminated thereby. The number of stack errors may also be reduced with the aid of wafer bonding.

The n⁻ substrate can have a doping greater than $10^{10}$ N/cm⁻³ and less than $10^{13}$ N/cm⁻³. In that the doping is extremely low, the n⁻ substrate may also be construed in the aforementioned exemplary embodiment as an intrinsic layer.

After reducing the thickness of the n⁻ substrate, the n⁺ layer can be generated on the n⁻ substrate in a range between $10^{18}$ N/cm⁻³ and less than $5\times10^{19}$ N/cm⁻³ with the aid of epitaxy or high-dose implantation. The reduction in the thickness of the n⁻ substrate preferably takes place with the aid of a CMP step, i.e. with the aid of chemical, mechanical polishing.

An auxiliary layer can be applied to the front of the diode structure. The back of the diode structure may then be reduced in thickness and placed on a carrier. In another refinement, the front side is subsequently removed.

The surface of the n⁺ substrate and the surface of the p⁺ substrate can be metallized to electrically connect the semiconductor diode. Following the metallization, the cathode of the semiconductor diode can be integrally connected to a base designed as a heat sink. In other words, the anode is formed on the surface of the diode, on the P⁺ layer.

Studies have shown that different reverse voltages are achievable with certain combinations of a p⁻ intermediate layer and an n⁻ layer.

In a first example, the: p⁻ intermediate layer has a thickness between 10 µm and 25 µm, and the n⁻ layer has a thickness between 40 µm and 90 µm, resulting in a reverse voltage of approximately 900 V.

In a second example, the: p⁻ intermediate layer has a thickness between 25 µm and 35 µm, and the n⁻ layer has a thickness between 40 µm and 70 µm, resulting in a reverse voltage of approximately 1,200 V.

In a third example, the: p⁻ intermediate layer has a thickness between 35 µm and 50 µm, and the n⁻ layer has a thickness between 70 µm and 150 µm, resulting in a reverse voltage of approximately 1500 V.

The diodes in the first through third variants may also be referred to as so-called punch-through diodes.

In a fourth example, the: p⁻ intermediate layer has a thickness between 10 µm and 25 µm and the n⁻ layer has a thickness between 60 µm and 110 µm.

In a fifth example, the: p⁻ intermediate layer has a thickness between 10 µm and 25 µm and the n⁻ layer has a thickness between 70 µm and 140 µm.

In a sixth example, the: p⁻ intermediate layer has a thickness between 35 µm and 50 µm and the n⁻ layer has a thickness between 80 µm and 200 µm.

The diodes in the fourth through sixth examples may also be referred to as "non-reach-through" diodes.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
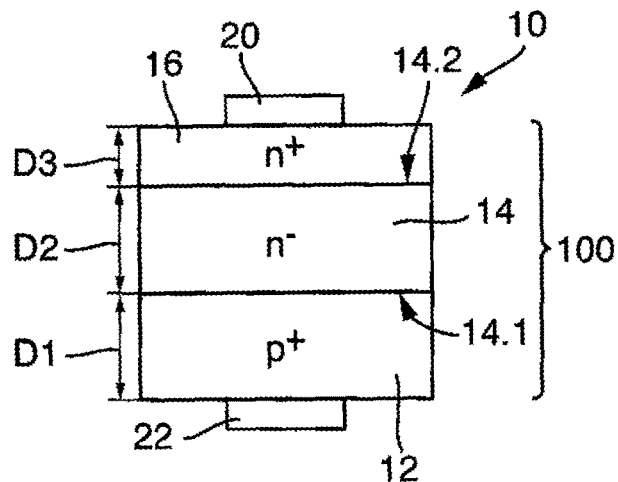
FIG. 1 shows a schematic view of a first specific embodiment of a stacked III-V semiconductor diode according to the invention.
Figure 2:
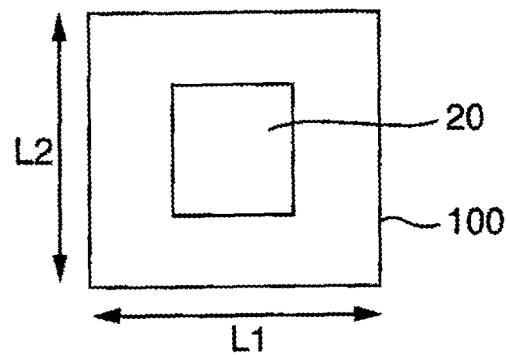
FIG. 2 shows a schematic top view of a specific embodiment of a stacked III-V semiconductor diode according to the invention.

The illustrations in FIGS. 1 and 2 show a side view and a top view of a first specific embodiment of a stacked III-V semiconductor diode 10 according to the invention. Semiconductor diode 10 comprises a stack 100, which includes three semiconductor layers as well as a first contact layer 20 and a second contact layer 22.

The first semiconductor layer is a p$^+$ layer 12 designed as a substrate, having an upper side, an underside and a dopant concentration of $5·10^{18}$ N/cm$^3$ to $5·10^{20}$ N/cm$^3$. The second semiconductor diode is an n$^-$ layer 14, which has a first surface 14.1, a second surface 14.2 opposite the first surface, a dopant concentration of $10^{12}$ N/cm$^3$ to $10^{17}$ N/cm$^3$ and a layer thickness D2 between 50 and 1000 μm. The third semiconductor layer is an n$^+$ layer 16, which has an upper side, an underside and a dopant concentration of at least $10^{19}$ N/cm$^3$.

An optional intermediate layer, preferably designed as a p$^-$ layer, is not illustrated. The optional intermediate layer is formed between n$^-$ layer 14 and p$^+$ layer 12.

The three semiconductor layers include a GaAs compound or are made up of a GaAs compound. Alternatively, n$^+$ layer 16 is designed as a substrate on which first n$^-$ layer 14 and then the p$^+$ layer are generated.

First contact layer 20 is disposed on an upper side of n$^+$ layer 16, i.e. on an upper side of stack 100, and integrally and electrically conductively connected to n$^+$ layer 16.

Second contact layer 22 is disposed on an underside of p$^+$ layer 12, i.e. on an underside of stack 100, and integrally and electrically conductively connected to p$^+$ layer 12.

Stack 100 made up of the three semiconductor layers has a rectangular circumference with a first edge length L1 and a second edge length L2. According to the illustrated exemplary embodiment, contact layers 20 and 22 also have a rectangular design with shorter edge lengths. n+ layer 16 surrounds first contact layer 20 and completely or partially covers n$^-$ layer 14. p$^+$ layer 12 has a dopant concentration K1, dopant concentration K1 having an essentially constant value in the range of $5·10^{18}$-$5·10^{20}$ N/cm$^3$ within the entire layer.

n$^+$ layer 12 has a dopant concentration K3, which also has an essentially constant value within the entire layer. The value of dopant concentration K3 of n$^+$ layer 12 is at least $10^{19}$ N/cm$^3$.

In contrast, n$^-$ layer 14 has a varying dopant concentration K2. Dopant concentration K2 of n$^-$ layer 14 has a first value W1 on first surface 14.1 of n$^-$ layer 14 adjacent to p$^+$ layer 12 and a second value W2 on second surface 14.2 of n$^-$ layer 14 adjacent to n$^+$ layer 16, first value W1 and second value W2 both being in a range from $10^{12}$ N/cm$^3$ to $10^{17}$ N/cm$^3$, and second value W2 of dopant concentration K1 being greater than first value W1 by a factor between 1.5 and 2.5. Dopant concentration K2 of n$^-$ layer 14 thus increases along layer thickness D2 of n$^-$ layer 14.

Figure 3:
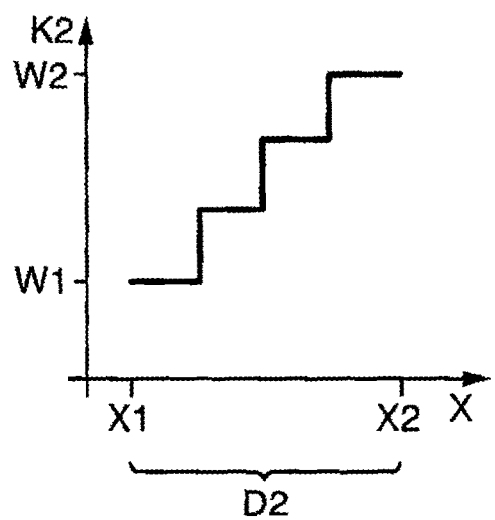
FIG. 3 shows a schematic view of a specific embodiment of a dopant concentration according to the invention over a layer thickness of an n⁻ layer of a semiconductor diode according to the invention.

In the illustration in FIG. 3, a curve of dopant concentration K2 of p$^-$ layer 14 in parallel to layer thickness D2 of n$^-$ layer 14 is illustrated schematically according to a first specific embodiment. Dopant concentration K2 of n$^-$ layer 14 has first value W1 on first surface 14.1, whose position is marked as x1, and second value W2 on second surface 14.2, whose position is market x2. Dopant concentration K2 increases in a stepped manner between first surface 14.1 and second surface 14.2, or between positions x1 and x2, i.e. dopant concentration K2 has a stepped curve, the stepped curve in the illustrated exemplary embodiment having three steps.

For example, first value W1 is $5·10^{14}$ N/cm$^3$, and second value W2 is $1·10^{16}$ N/cm$^3$.

Figure 4:
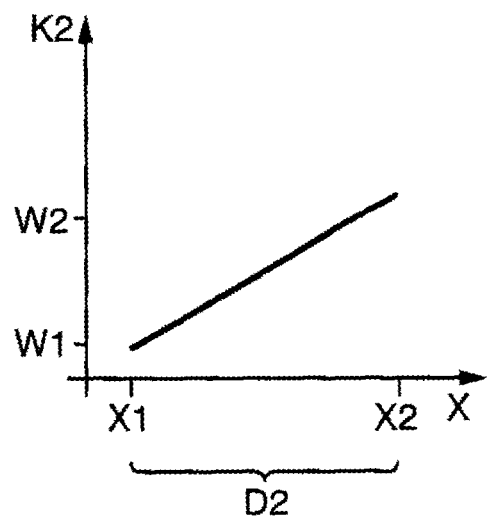
FIG. 4 shows a schematic view of another specific embodiment of a dopant concentration according to the invention over a layer thickness of an n⁻ layer of a semiconductor diode according to the invention.

In the illustration in FIG. 4, an alternative curve of dopant concentration K2 of n$^-$ layer 14 in parallel to layer thickness D2 of n$^-$ layer 14 is illustrated schematically according to a first specific embodiment. The dopant concentration increases between first value W1 and second value W2 along layer thickness D2 continuously and with a constant slope, i.e. dopant concentration K2 of n$^-$ layer 14 has a continuous curve with a constant slope.

The invention being thus described, it will be obvious that the same may be varied in many ways. Such variations are not to be regarded as a departure from the spirit and scope of the invention, and all such modifications as would be obvious to one skilled in the art are to be included within the scope of the following claims:

What is claimed is:

1. A stacked III-V semiconductor diode comprising:
    a n$^-$ layer having a first surface, a second surface opposite the first surface, a dopant concentration of $10^{12}$ N/cm$^3$ to $10^{17}$ N/cm$^3$ and a layer thickness of 50 μm to 1,000 μm;
    a p$^+$ layer integrally connected to the first surface of the n$^-$ layer or an intermediate layer disposed between the n$^-$ layer and the p$^+$ layer, the p$^+$ layer having a dopant concentration of $5·10^{18}$ N/cm$^3$ to $5·10^{20}$ N/cm$^3$;
    a n+ layer integrally connected to the second surface if the n$^-$ layer has a dopant concentration of at least $10^{19}$ N/cm$^3$,
    wherein the p$^+$ layer, the n$^-$ layer and the n$^+$ layer each have a monolithic design and include a GaAs compound or consist of a GaAs compound, the n$^-$ layer being a GaAs layer,
    wherein the n$^+$ layer or the p$^+$ layer is a substrate layer,
    wherein the dopant concentration of the n$^-$ layer has a first value on the first surface formed in a direction of the p$^+$ layer and a second value on the second surface adjacent to the n$^+$ layer, and
    wherein the second value of the dopant concentration is greater than the first value by a factor of at least 1.5 or by a factor of at least 2 or by a factor of at least 2.5.

2. The stacked III-V semiconductor diode according to claim 1, wherein the dopant concentration of the n$^-$ layer has a stepped curve from the first value to the second value in parallel to the layer thickness of the n$^-$ layer, the stepped curve including at least one step.

3. The stacked III-V semiconductor diode according to claim 1, wherein the dopant concentration of the n$^-$ layer has a continuous curve from the first value to the second value in parallel to the layer thickness of the n$^-$ layer.

4. The stacked III-V semiconductor diode according to claim 3, wherein the continuous curve has a constant slope.

5. The stacked III-V semiconductor diode according to claim 1, wherein the p$^+$ layer is a substrate having a layer thickness of 50 μm to 500 μm, and the n$^+$ layer has a layer thickness of less than 30 μm.

6. The stacked III-V semiconductor diode according to claim 1, wherein the n$^+$ layer is a substrate having a layer thickness of 50 μm to 400 μm, and wherein the p$^+$ layer has a layer thickness greater than 2 μm.

7. The stacked III-V semiconductor diode according to claim 1, wherein the p$^+$ layer includes zinc.

8. The stacked III-V semiconductor diode according to claim 1, wherein the n$^+$ layer and/or the n$^-$ layer includes chromium and/or silicon and/or palladium and/or tin.

9. The stacked III-V semiconductor diode according to claim 1, wherein a total height of a stacked layer structure, made up of the p$^+$ layer, the n$^-$ layer and the n$^+$ layer, is no more than 150 μm to 500 μm.

10. The stacked III-V semiconductor diode according to claim 1, wherein a stacked layer structure, made up of the p$^+$ layer, the n$^-$ layer and the n$^+$ layer, has a rectangular or square surface with edge lengths between 1 mm and 10 mm, the n⁺ layer covering the first contact layer, and the n⁻ layer completely or partially covering the n⁺ layer.

11. The stacked III-V semiconductor diode according to claim 1, wherein a stacked layer structure, made up of the p⁺ layer, the n⁻ layer and the n⁺ layer, has an oval or circular surface, the n⁺ layer covering the first contact layer, and the n⁻ layer completely or partially covering the n⁺ layer.

12. The stacked III-V semiconductor diode according to claim 1, wherein a semiconductor bond is formed between the p⁺ layer and the n⁻ layer or between the intermediate layer and the n⁻ layer.

13. The stacked III-V semiconductor diode according to claim 1, wherein the n+ layer or the p+ layer is a GaAs layer.

14. The stacked III-V semiconductor diode according to claim 1, wherein the n+ layer or the p+ layer is a GaAs layer.

15. A stacked III-V semiconductor diode comprising:
a n⁻ layer having a first surface, a second surface opposite the first surface, a dopant concentration of $10^{12}$ N/cm³ to $10^{17}$ N/cm³ and a layer thickness of 50 μm to 1,000 μm;
a p⁺ layer integrally connected to the first surface of the n⁻ layer or an intermediate layer disposed between the n⁻ layer and the p⁺ layer, the p⁺ layer having a dopant concentration of $5 \cdot 10^{18}$ N/cm³ to $5 \cdot 10^{20}$ N/cm³;
a n+ layer integrally connected to the second surface if the n⁻ layer has a dopant concentration of at least $10^{19}$ N/cm³,
wherein the p⁺ layer, the n⁻ layer and the n⁺ layer each have a monolithic design and include a GaAs compound or consist of a GaAs compound,
wherein the n⁺ layer or the p⁺ layer is a substrate layer,
wherein the dopant concentration of the n⁻ layer has a first value on the first surface formed in a direction of the p⁺ layer and a second value on the second surface adjacent to the n⁺ layer,
wherein the second value of the dopant concentration is greater than the first value by a factor of at least 1.5 or by a factor of at least 2 or by a factor of at least 2.5, and
wherein an intermediate layer is formed between the p⁺ layer and the n⁻ layer.

16. A stacked III-V semiconductor diode comprising:
a n⁻ layer having a first surface, a second surface opposite the first surface, a dopant concentration of $10^{12}$ N/cm³ to $10^{17}$ N/cm³ and a layer thickness of 50 μm to 1,000 μm;
a p⁺ layer integrally connected to the first surface of the n⁻ layer or an intermediate layer disposed between the n⁻ layer and the p⁺ layer, the p⁺ layer having a dopant concentration of $5 \sim 10^{18}$ N/cm³ to $5 \cdot 10^{20}$ N/cm³;
a n+ layer integrally connected to the second surface if the n⁻ layer has a dopant concentration of at least $10^{19}$ N/cm³,
wherein the p⁺ layer, the n⁻ layer and the n⁺ layer each have a monolithic design and the n– layer being a GaAs layer,
wherein the n⁺ layer or the p⁺ layer is a substrate layer,
wherein the dopant concentration of the n⁻ layer has a first value adjacent to the first surface and a second value on the second surface adjacent to the n⁺ layer, and
wherein the second value of the dopant concentration is greater than the first value by a factor of at least 1.5 or by a factor of at least 2 or by a factor of at least 2.5.

* * * * *